(12) United States Patent
Houser et al.

(10) Patent No.: US 6,298,761 B1
(45) Date of Patent: Oct. 9, 2001

(54) THIN FILM HOLE MAKING APPARATUS

(75) Inventors: David E. Houser, Apalachin; Candido C. Tiberia, Endicott; James A. Veasaw, Owego, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/306,901

(22) Filed: May 7, 1999

(51) Int. Cl.[7] .................................................. B26D 5/08
(52) U.S. Cl. ................. 83/575; 83/577; 83/571; 83/687; 83/691
(58) Field of Search ..................... 83/698.21, 691, 83/687, 685, 575, 577, 571

(56) References Cited

U.S. PATENT DOCUMENTS

| | | | |
|---|---|---|---|
| 3,570,345 | * 3/1971 | Spengler | 83/698.21 |
| 3,763,731 | * 10/1973 | Wistedt | 83/698.21 |
| 3,782,166 | 1/1974 | Whistler, Jr. et al. | 72/462 |
| 4,210,047 | 7/1980 | Haas et al. | 83/530 |
| 4,215,610 | 8/1980 | Lemmer | 83/565 |
| 4,233,873 | 11/1980 | Jessen | 83/652 |
| 4,303,054 | * 12/1981 | Lore | 125/11 R |
| 5,138,919 | 8/1992 | Wilhelm | 83/139 |
| 5,178,051 | 1/1993 | Smith et al. | 83/685 |

FOREIGN PATENT DOCUMENTS

| | | |
|---|---|---|
| 0 608 152 A1 | 1/1994 | (EP) . |
| 58-000325 | 1/1983 | (JP) . |

* cited by examiner

Primary Examiner—M. Rachuba
(74) Attorney, Agent, or Firm—Salzman & Levy; Lawrence R. Fraley

(57) ABSTRACT

An apparatus for fabricating holes in a thin film has an elongated holding block for holding a column of electromagnetic driving coils. The holding block acts as a single unit, and is magnetically attached to a punch diebar. The magnetic attraction between the holding block and diebar provides easy assembly and disassembly of the parts.

6 Claims, 2 Drawing Sheets

THIN FILM HOLE MAKING APPARATUS

FIELD OF THE INVENTION

The present invention relates to a thin film hole making apparatus and, more particularly, to a thin film hole punching die apparatus that is easily assembled and disassembled by means of magnetic coupling forces.

BACKGROUND OF THE INVENTION

In the manufacture of circuit boards and thin film polyimide laminate assemblies, it is often necessary to fabricate small via holes. The vias are used to connect top, bottom and intermediate circuity layers. The present process for creating these small holes requires from eight to ten, one inch square electromagnetic repulsion drive coils that propel a punch through the polyimide material layers. The coils are individually screw fastened to diebars, which provide proper alignment for the holes.

The process is tedious and time consuming. Each job requires different part spacings and frequent maintenance dictated by having to clean each coil.

The present invention features a coil holding block that holds a column of individual coils. The holding block acts as a single unit, and is magnetically attached to a punch diebar. The magnetic attraction between the holding block and die bar provides easy assembly and disassembly of the parts. The magnetic assembly reduces the replacement time for the coils from a previous forty-five minutes to less than one minute.

Milled pockets in a lower portion of the holding block provide proper static punch height. In the previous assembly, such spacing had to be individually aligned by hand under each coil. Thus, the coil block holder of this invention eliminates the requirement for individual spacers, tedious spacer/coil alignment, and the screw unfastening of the coils.

DISCUSSION OF RELATED ART

In European Patent Publication No. 0 608 152 A1, published on Jul. 24, 1994, rotary press cutters are illustrated that are used in the production of envelope blanks, and feature a flexible foil cutting die. An outer portion of a blade of the die is held against an outer periphery of the roller by magnetic attraction.

In U.S. Pat. No. 5,178,051, issued to Smith et al on Jan. 12, 1993 for Magnetic Punch Die Retention for HTCC/LTCC Fabrication, a die punch apparatus is illustrated. The die punch apparatus includes an electromagnetic die head core. Single punches are magnetically held in the die to facilitate changing the punches in a simple retooling process.

In U.S. Pat. No. 5,138,919, issued to Wilhelm on Aug. 18, 1992 for Magnetic Holder for Punch Stripper, a stripper for stripping a punched workpiece from a punch press is illustrated. The stripper has a magnetic holder to retain the stripper on the punch.

In U.S. Pat. No. 4,215,610 issued on Aug. 5, 1980 to Lemmer for Apparatus for Perforating a Foil, a reduced motion system carrying a foil punching device is illustrated. The foil punching device is magnetically held in place.

In U.S. Pat. No. 4,233,873 issued on Nov. 18, 1980 to Jessen for Permanent Magnetic Hold Down for Steel Rule Dies, steel rule dies for cutting patterns are illustrated. Each die is held magnetically to a steel chase during the cutting operation.

In U.S. Pat. No. 4,210,047, issued to Haas et al on Jul. 1, 1980 for Die Cutting Machine with Magnetic Holder for Accurate Die Positioning, a magnetic die holder is illustrated. The die holder is magnetically held and supported upon a die carrying section.

U.S. Pat. No. 3,782,166, issued to Whistler, Jr. et al on Jan. 1, 1974 for Die Set Assembly and Magnet Means for Releasably Attaching Dies Therein, features an assembly containing magnets for releasably attaching dies thereto. A template arrangement is provided for aligning the die set.

In Japanese Publication No. 58-000325, published on Jan. 5, 1983, a magnetic position device is described which moves a plate of material back and forth and left and right, and a die positioning device that moves a die to and from a work portion via a chain.

SUMMARY OF THE INVENTION

In accordance with the present invention, there is provided an apparatus for fabricating holes in a thin film. A holding block is provided for holding a column of individual electromagnetic driving coils. The holding block acts as a single unit, and is magnetically attached to a punch diebar. The magnetic attraction between the holding block and die bar provides easy assembly and disassembly of the parts. Milled pockets define a first series of apertures that are disposed in a lower portion of the holding block. They provide proper static punch height. The holder also includes means defining a second series of apertures. The second series of apertures carries magnets for attaching the holding block to the punch diebar.

It is an object of this invention to provide an improved hole making device.

It is another object of the invention to provide a hole making apparatus having a coil holding bar that is magnetically assembled and disassembled from a diebar.

BRIEF DESCRIPTION OF THE DRAWINGS

A complete understanding of the present invention may be obtained by reference to the accompanying drawings, when considered in conjunction with the subsequent detailed description, in which.

For purposes of clarity and brevity, like elements and components will bear the same designation and numbering throughtout all the figures.

DESCRIPTION OF THE PREFERRED EMBODIMENT

Generally speaking, the invention features an apparatus for fabricating holes in a thin film. A holding block is provided for holding a column of electromagnetic driving coils. The holding block acts as a single unit, and is magnetically attached to a punch diebar. The magnetic attraction between the holding block and diebar provides easy assembly and disassembly of the parts.

Figure 1:
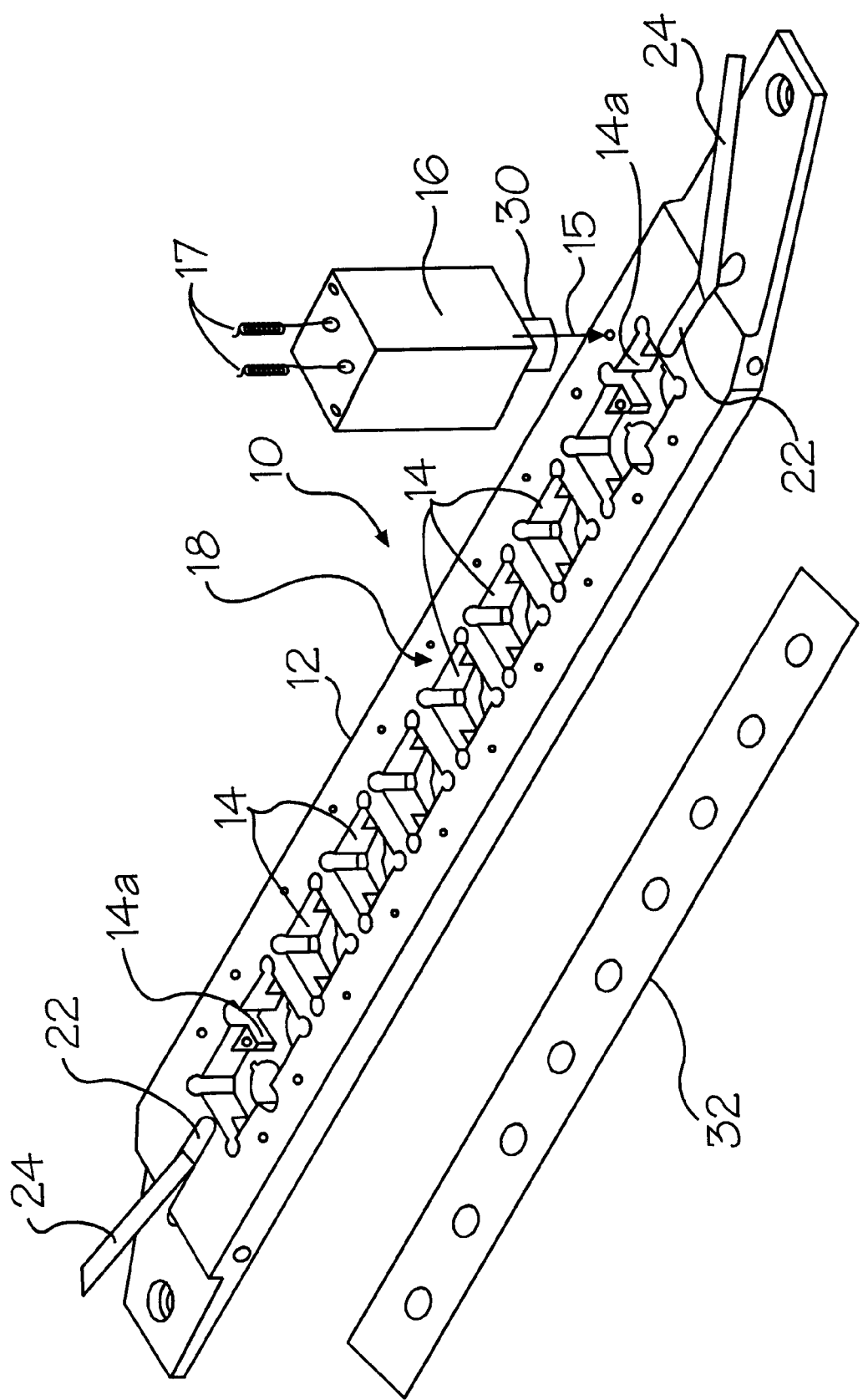
FIG. 1 illustrates a perspective, exploded, top view of a coil holding bar of this invention in situation with a die ban.

Now referring to FIG. 1, a top view of a coil holding bar 10 is illustrated. The coil holding bar 10 comprises an elongated member 12 having a series of square-shaped apertures 14 disposed in a column formation on the upper face 18. End apertures 14a are designed to receive two electromagnetic driving coils 16. Each aperture 14 therebetween receives (arrow 15) a single electromagnetic driving coil 16. Each electromagnetic driving coil 16 is secured to member 12 by means of screws, or other fastening means (not shown). FIG. 1 shows a typical electromagnetic driving coil 16 having wires 17 for receiving current to power the hole punch 30.

Figure 2:
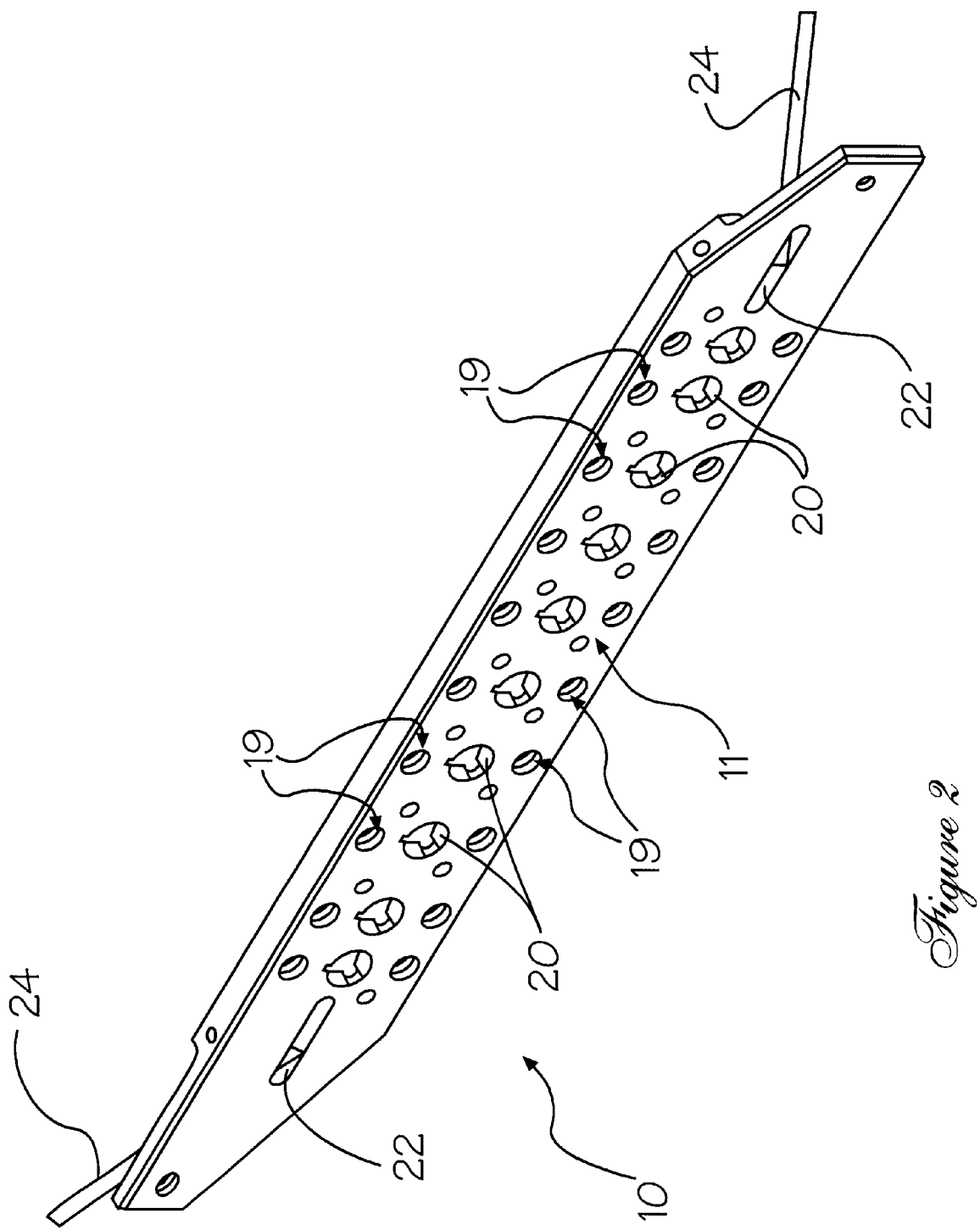
FIG. 2 shows a perspective, bottom view of the coil holding bar depicted in FIG. 1.

Referring now also to FIG. 2, a bottom view of the coil holding bar 10 is shown. The bottom face 11 of the holding bar 10 comprises a series of apertures 19 that contain permanent magnets for magnetically attaching the coil holding bar 10 to the diebar 32. The hole punch projects through the milled holes 20. The milled holes 20 provide the proper static punch height for each hole punch, so there is no need for shims or other alignment materials.

The elongated member 12 has two slots respectively disposed on distal ends thereof. A camming tool 24 is pushed into each of the slots 22 for forcing the coil holding bar apart from its magnetically held diebar. The camming tool 24 breaks the magnetic striction between the bar members, thus forcing them to separate.

Since other modifications and changes varied to fit particular operating requirements and environments will be apparent to those skilled in the art, the invention is not considered limited to the example chosen for purposes of and covers all changes and modifications which do not constitute departures from the true spirit and scope of this invention.

Having thus described the invention, what is desired to be protected by Letters Patent is presented in the subsequently appended claims.

What is claimed is:

1. An apparatus for fabricating holes in a circuit board member, comprising at least one hole fabricating punch including an electromagnetic die head comprising a magnetic coiled solenoid that holds said hole fabricating punch, a holding bar having means defining at least one first aperture disposed therein for receiving said electromagnetic die head, and means defining at least one second aperture containing magnetic means for magnetically attracting and attaching a diebar to said holding bar, said at least one first aperature being positioned above said diebar a given height.

2. The apparatus for fabricating holes in a circuit board member in accordance with claim 1, wherein said magnetic means comprises a permanent magnet.

3. An apparatus for fabrication holes in a sheet member, comprising a plurality of hole fabricating tools, a holding bar having means defining a first row of apertures disposed therein for receiving said plurality of hole fabricating punches, and means defining at least one second row of apertures containing magnetic means for magnetically attracting and attaching a diebar to said holding bar, said plurality of hole fabricating punches being disposed in said first row of apertures and located a given distance above said diebar.

4. The apparatus for fabricating holes in a sheet member in accordance with claim 3, wherein said magnetic means comprises a permanent magnet.

5. An apparatus for fabricating holes in a sheet member, comprising a plurality of hole fabricating punches, an elongated holding bar having means defining a row of first apertures disposed therein for receiving said plurality of hole fabricating punches, and means defining a pair of rows of second apertures each containing a permanent magnetic for magnetically attracting and attaching a diebar to said holding bar, said plurality of hole fabricating punches being disposed in said first row of apertures and located a given distance above said diebar.

6. The apparatus for fabricating holes in a sheet member in accordance with claim 5, wherein said gated holding bar has respective distal ends and a slot disposed at each respective distal end, and further comprising a camming tool for respective insertion into each slot for separating said elongated holding bar from said diebar.

* * * * *